(12) United States Patent
Chen et al.

(10) Patent No.: US 10,383,252 B2
(45) Date of Patent: Aug. 13, 2019

(54) SOLID STATE DISK MODULE AND HEAT SINK DEVICE THEREOF

(71) Applicant: CompTake Technology Inc., New Taipei (TW)

(72) Inventors: Wei-Hau Chen, New Taipei (TW); Hsin-An Chen, New Taipei (TW)

(73) Assignee: COMPTAKE TECHNOLOGY INC., New Taipei (TW)

( * ) Notice: Subject to any disclaimer, the term of this patent is extended or adjusted under 35 U.S.C. 154(b) by 94 days.

(21) Appl. No.: 15/867,720

(22) Filed: Jan. 11, 2018

(65) Prior Publication Data
US 2019/0215983 A1    Jul. 11, 2019

(51) Int. Cl.
*H05K 7/20* (2006.01)
*G06F 1/20* (2006.01)

(52) U.S. Cl.
CPC ............. *H05K 7/2039* (2013.01); *G06F 1/20* (2013.01)

(58) Field of Classification Search
CPC .................................. G06F 1/20; H05K 7/2039
USPC ........................................................ 361/709
See application file for complete search history.

(56) References Cited

U.S. PATENT DOCUMENTS

| | | | | |
|---|---|---|---|---|
| 6,130,821 | A * | 10/2000 | Gerber | H01L 23/4093 165/185 |
| 6,396,695 | B1 * | 5/2002 | Lee | H01L 23/4093 257/E23.086 |
| 7,408,781 | B1 * | 8/2008 | Chen | H01L 23/3672 165/104.33 |
| 2002/0024796 | A1 * | 2/2002 | Shih | H01L 23/3672 361/703 |
| 2006/0007660 | A1 * | 1/2006 | Yatskov | H01L 23/4006 361/709 |
| 2006/0023423 | A1 * | 2/2006 | Kuo | F28F 3/02 361/697 |
| 2007/0047207 | A1 * | 3/2007 | McPhee | H01L 23/40 361/704 |
| 2008/0298058 | A1 * | 12/2008 | Kan | F21V 15/01 362/240 |
| 2009/0034183 | A1 * | 2/2009 | Chen | G06F 1/20 361/679.47 |
| 2009/0141452 | A1 * | 6/2009 | Wayman | H01L 23/367 361/704 |
| 2010/0315784 | A1 * | 12/2010 | Schlittmeier | H01L 23/4093 361/709 |
| 2011/0031864 | A1 * | 2/2011 | Rebergen | F21K 9/00 313/11 |

(Continued)

*Primary Examiner* — Jacob R Crum
(74) *Attorney, Agent, or Firm* — Chun-Ming Shih; HDLS IPR Services

(57) ABSTRACT

A heat sink device of solid state disk module includes a heat sink and at least one fixture. The heat sink includes a heat sink body heat conducting with the solid state disk and a pair of sliding slots disposed on the heat sink body. The fixture includes a bottom plate and a pair of side plates. The bottom plate has at least one rib, and the pair of side plates have pressing structures corresponding to the pair of the sliding slots. The pressing structure includes a flap being capable of pressing in the sliding slot and a pull-ab located at a side of the flap. The heat sink body is fixed on the solid state disk through the fixture, and an interval is maintained between the bottom plate and the solid state disk by the at least one rib.

17 Claims, 4 Drawing Sheets

(56) References Cited

U.S. PATENT DOCUMENTS

2011/0267780 A1* 11/2011 Thrailkill ............ F21V 29/004
                                                                      361/709

* cited by examiner

SOLID STATE DISK MODULE AND HEAT SINK DEVICE THEREOF

BACKGROUND OF THE INVENTION

Field of the Invention

The present invention generally relates to a heat sink and, in particular to heat sink device of solid state disk.

Description of Prior Art

High-speed operation of electronic components will inevitably generate heat. Overheating will reduce work efficiency of electronic components or even shorten the service life. Especially more and more sophisticated data storage devices, the failure rate will be increased if the heat dissipation is not processed in time.

Moreover, solid state states (SSD) are one type of data storage devices and have advantages of small volume, large capacity and have no noises so that more and more solid state states are widely used in servers and other electronic products. Therefore, how to provide proper heat sinks for solid state disks so as to dissipate heat thereof and to combine heat sinks with solid state disks quickly are motivations of the present inventor.

In view of the above drawbacks, the Inventor proposes the present invention based on his expert knowledge and elaborate researches in order to solve the problems of prior art.

SUMMARY OF THE INVENTION

Accordingly, an object of the present invention is to provide a solid state drive module and heat sink device thereof for dissipating heat of the solid state disk quickly and combining the heat sink device with the solid state disk fast.

In order to achieve the object mentioned above, the present invention provides a solid state disk module and a heat sink device thereof including a heat sink and at least one fixture. The heat sink includes a heat sink body heat conducting with the solid state disk and a pair of sliding slots disposed at opposite sides of the heat sink body. The fixture includes a bottom plate and a pair of side plates extended from opposite sides of the bottom plate. The bottom plate has at least one rib, and the pair of side plates have pressing structures corresponding to the pair of the sliding slots. Each pressing structure comprises a flap being capable of pressing in the sliding slot and a pull-ab located at a side of the flap, wherein the heat sink body is fixed on the solid state disk through the fixture, and an interval is maintained between the bottom plate and the solid state disk by the at least one rib.

Comparing to the prior art, the heat sink device of the present invention is implemented by fixing the heat sink on the solid state disk through the fixtures. Users apply force to the pull-tab for opening the fixture and make the flap buckled in the sliding slot of opposite sides of the heat sink. Thereby, the heat sink is fixed on the solid state disk through the fixture so as to combine the heat sink device with the solid state disk fast and dissipate heat of the solid state disk quickly, thus to enhance the convenience and practicality of the present invention.

BRIEF DESCRIPTION OF DRAWING

The features of the invention believed to be novel are set forth with particularity in the appended claims. The invention itself, however, may be best understood by reference to the following detailed description of the invention, which describes a number of exemplary embodiments of the invention, taken in conjunction with the accompanying drawings, in which:

DETAILED DESCRIPTION OF THE PREFERRED EMBODIMENTS

In cooperation with attached drawings, the technical contents and detailed description of the invention are described thereinafter according to a number of preferable embodiments, being not used to limit its executing scope. Any equivalent variation and modification made according to appended claims is all covered by the claims claimed by the present invention.

Figure 1:
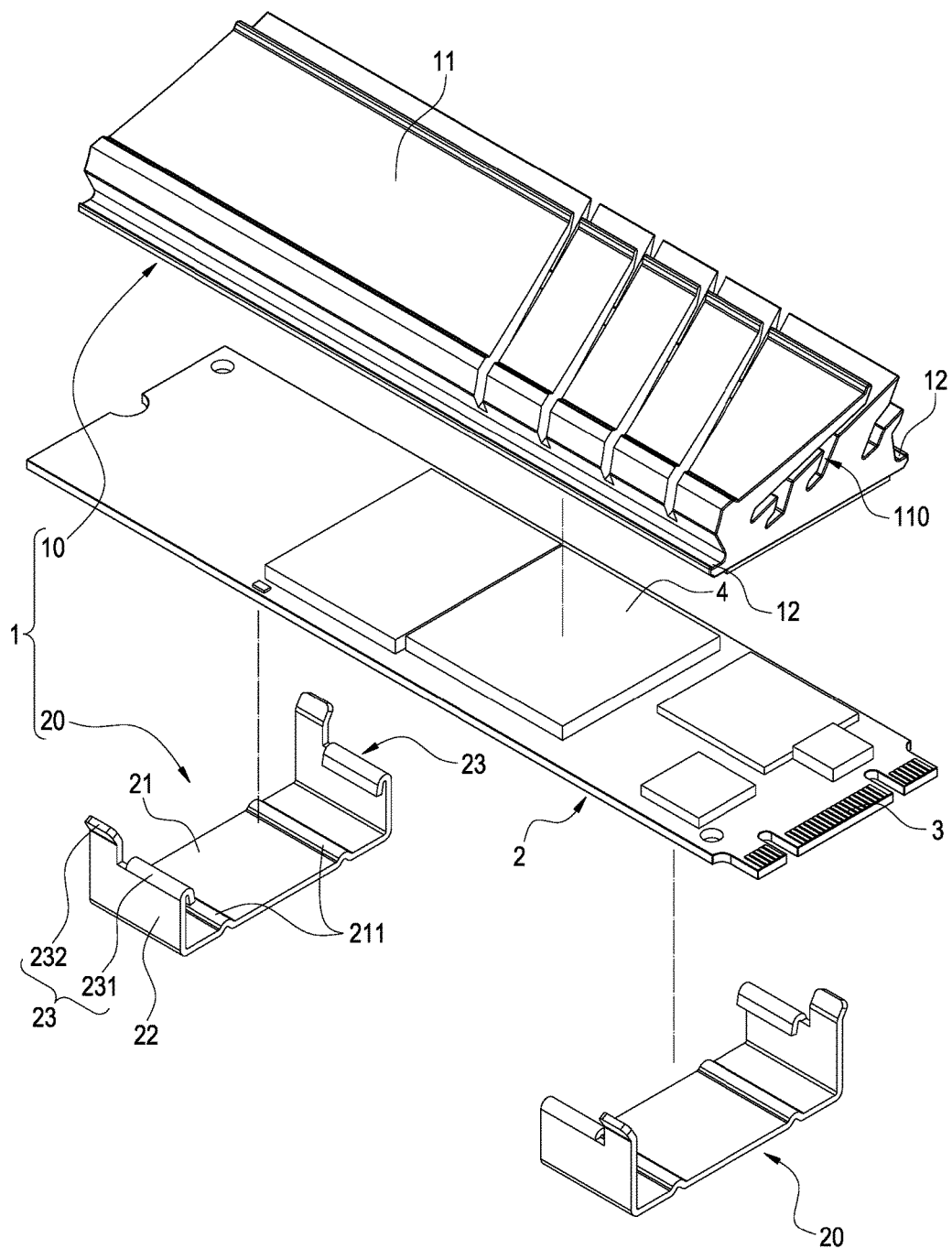
FIG. 1 is a perspective explosion schematic view of solid state disk module and heat sink device thereof of the present invention.
Figure 2:
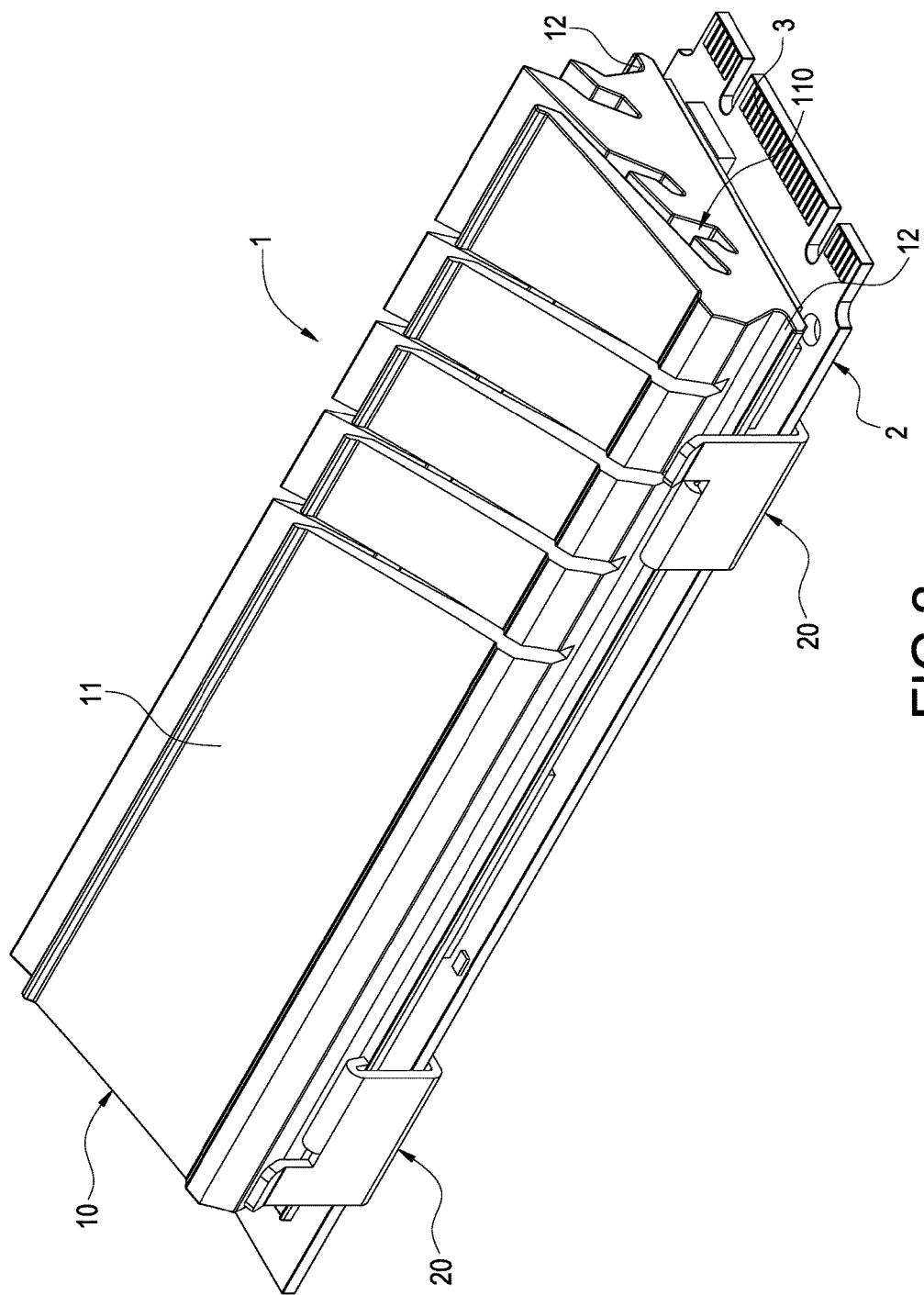
FIG. 2 is a perspective schematic view of solid state disk module and heat sink device thereof of the present invention.
Figure 3:
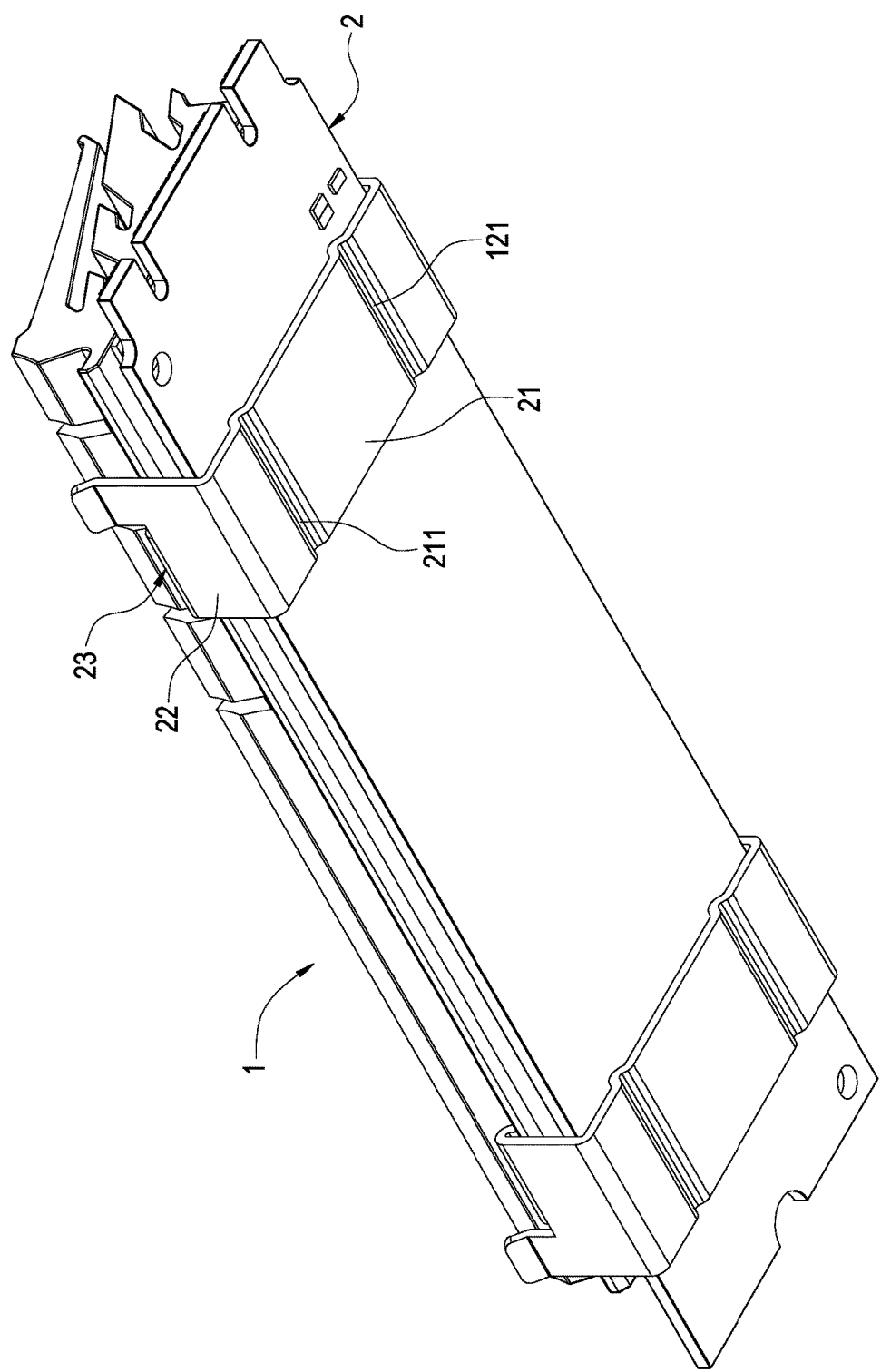
FIG. 3 is another perspective schematic view of solid state disk module and heat sink device thereof of the present invention.

Please refer to FIG. 1 to FIG. 3, which depict a perspective explosion schematic view of solid state disk module and heat sink device thereof and perspective schematic views of two sides of solid state disk module and heat sink device thereof of the present invention. The present invention provides a solid state disk module including a heat sink device 1 and a solid state disk 2. The heat sink device 1 combines with the solid state disk 2 for dissipating heat of the solid state disk 2. More detailed descriptions of the combination of the heat sink device 1 and the solid state disk 2 are as follows.

The heat sink device 1 includes a heat sink 10 and at least one fixture 20. The heat sink 10 is fixed on the solid state disk 2 through the fixture 20.

In the present embodiment, the heat sink 10 includes a heat sink body 11 heat conducting with the solid state disk 2 and a pair of sliding slots 12 disposed at opposite sides of the heat sink body11. Preferably, the heat sink body 11 has a plurality of grooves 110, and the grooves 110 are disposed on the heat sink body 11 at interval. In addition, the grooves 110 are provided with dendritic cross sections so as to facilitate the airflow to flow into the grooves 110 to remove the heat of the heat dissipation body 11.

The fixture 20 includes a bottom plate 21 and a pair of side plates 22 extended from opposite sides of the bottom plate 21. The bottom plate 21 has at least one rib 211, and the pair of side plates 22 has pressing structures corresponding to the pair of the sliding slots 12. Each of the pressing structure 23 comprises a flap 231 being capable of pressing in the sliding slot 12 and a pull-tab 232 located at a side of the flap 231. Preferably, the fixture 20 is configured in U shape. The bottom plate 21 has a plurality of ribs 211 spaced apart and disposed symmetrically so as to facilitate applying force to the pull-tab 232 of the pressing structure 23 to make the clamp 20 deformed, and further, the fixture 20 can be disposed on the heat sink 10.

Specifically, the flap 231 of the pressing structure 23 is bent in a direction from the side plate 22 toward the sliding slot 12. Besides, an outer end of the pull-tab 232 of the pressing structure 23 is tiltedly disposed in a direction from the side plate 22 away the heat sink body 10 so as to facilitate applying force to the pull-tab 232 to make the flap 231 buckled in the sliding groove 12 on the opposite sides of the heat sink 10.

Preferably, the heat sink device 1 includes a plurality of fixtures 20, and the fixtures 20 are disposed on the heat sink body 10 at interval. Thereby, the heat sink 10 can be fixed firmly on the solid state disk 2 through the fixtures 20.

Figure 4:
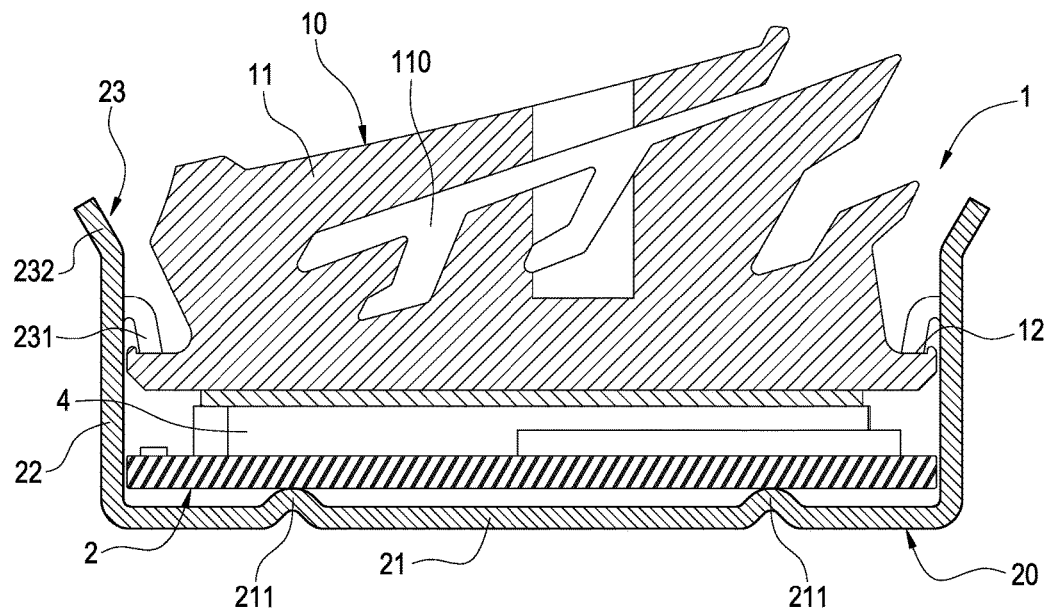
FIG. 4 is a cross sectional schematic view of solid state disk module and heat sink device thereof of the present invention.
Figure 5:
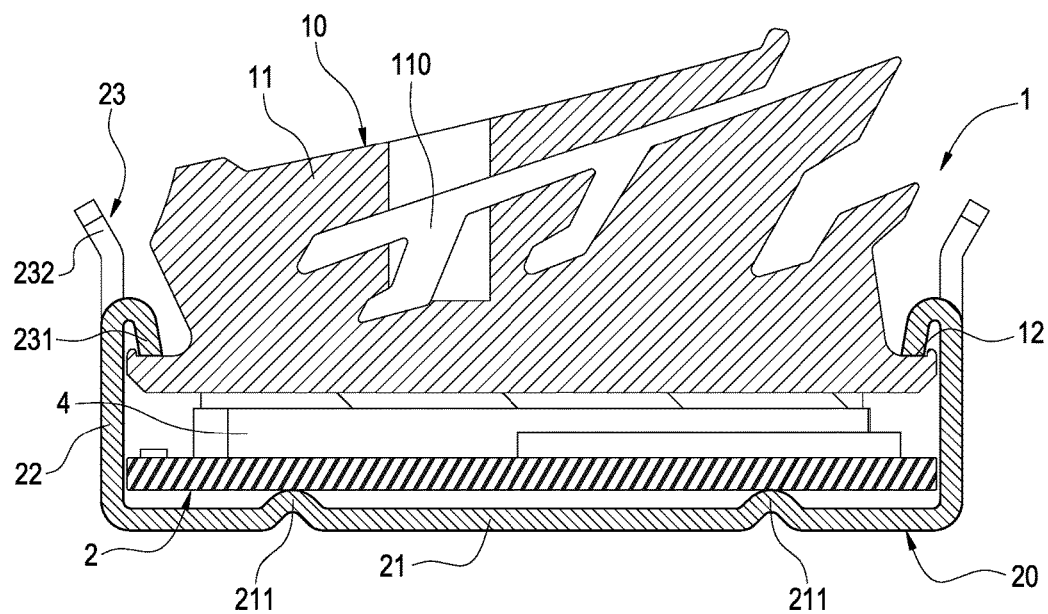
FIG. 5 is another cross sectional schematic view of solid state disk module and heat sink device thereof of the present invention.

Please refer to FIG. 4 and FIG. 5, which depict cross sectional schematics views of two sides of solid state disk module and the heat sink device thereof of the present invention. In the present embodiment, one side of the solid state disk 2 has a plurality of gold fingers 3 for inserting an electric component. Moreover, the solid state disk 2 includes at least one heating component 4.

The heat sink device 1 of the present invention is implemented by fixing the heat sink 10 on the solid state disk 2 through the fixtures 20. Users apply force to the pull-tab 232 for opening the fixture 20 and make the flap 231 buckled in the sliding slot 12 of opposite sides of the heat sink 10. In real practice, the quantity of the fixtures 20 can be adjusted according to actual needs. Besides, the positions of the fixtures 20 can be adjusted according to the locations of the pair of the flaps 231 at the sliding slots 12.

It is worth noticing that when the fixture 20 is buckled on the heat sink 10, an interval is maintained between the bottom plate 21 and the solid state disk 2 by the at least one rib 211. The deposition of the rib 211 is arranged to facilitate the airflow to flow between the solid state disk 2 and the bottom plate 21 so as to dissipate the heat of the bottom of the solid state disk 2. In addition, the circuits of the solid state disk 2 are arranged away from the position of the rib 211 to prevent short circuit of the solid state disk 2.

Although the present invention has been described with reference to the preferred embodiment thereof, it will be understood that the invention is not limited to the details thereof. Various substitutions and improvements have been suggested in the foregoing description, and others will occur to those of ordinary skill in the art. Therefore, all such substitutions and improvements are intended to be embraced within the scope of the invention as defined in the appended claims.

What is claimed is:

1. A heat sink device of a solid state disk module for dissipating heat of a solid state disk, comprising:
   a heat sink including a heat sink body in thermal contact with the solid state disk and a pair of sliding slots disposed at opposite sides of the heat sink body; and
   at least one fixture including a bottom plate and a pair of side plates extended from opposite sides of the bottom plate; the bottom plate having at least one rib, and the pair of side plates having pressing structures corresponding to the pair of the sliding slots; each of the pressing structures comprising a flap being capable of pressing in the sliding slot and a pull-tab located at a side of the flap;
   wherein the heat sink body is fixed on the solid state disk through the fixture, and an interval is maintained between the bottom plate and the solid state disk by the at least one rib.

2. The heat sink device according to claim 1, wherein the heat sink body has a plurality of grooves; the grooves are disposed on the heat sink body at an interval.

3. The heat sink device according to claim 2, wherein the grooves are provided with dendritic cross sections.

4. The heat sink device according to claim 1, wherein the bottom plate has a plurality of ribs spaced apart and disposed symmetrically.

5. The heat sink device according to claim 1, wherein the flap of the pressing structure is bent in a direction from the side plate toward the sliding slot.

6. The heat sink device according to claim 1, wherein an outer end of the pull-tab of the pressing structure is tiltedly disposed in a direction from the side plate away the heat sink body.

7. The heat sink device according to claim 1, wherein the heat sink device includes a plurality of fixtures, and the fixtures are disposed on the heat sink body at an interval.

8. The heat sink device according to claim 1, wherein the fixture is configured in a U shape.

9. A solid state disk module:
   a solid state disk; and
   a heat sink device combining with the solid state disk for dissipating heat of the solid state disk, including:
   a heat sink including a heat sink body heat conducting with the solid state disk and a pair of sliding slots disposed at opposite sides of the heat sink body; and
   at least one fixture including a bottom plate and a pair of side plates extended from opposite sides of the bottom plate; the bottom plate having at least one rib, and the pair of side plates having pressing structures corresponding to the pair of the sliding slots; each of the pressing structures comprising a flap being capable of pressing in the sliding slot and a pull-tab located at a side of the flap;
   wherein the heat sink body is fixed on the solid state disk through the fixture, and an interval is maintained between the bottom plate and the solid state disk by the at least one rib.

10. The solid state disk module according to claim 9, wherein the heat sink body has a plurality of grooves; the grooves are disposed on the heat sink body at an interval.

11. The solid state disk module according to claim 10, wherein the grooves are provided with dendritic cross sections.

12. The solid state disk module according to claim 9, wherein the bottom plate has a plurality of ribs spaced apart and disposed symmetrically.

13. The solid state disk module according to claim 9, wherein the flap of the pressing structure is bent in a direction from the side plate toward the sliding slot.

14. The solid state disk module according to claim 9, wherein an outer end of the pull-tab of the pressing structure is tiltedly disposed in a direction from the side plate away from the heat sink body.

15. The solid state disk module according to claim 9, wherein the heat sink device includes a plurality of fixtures, and the fixtures are disposed on the heat sink body at an interval.

16. The solid state disk module according to claim 9, wherein the fixture is configured in a U shape.

17. The solid state disk module according to claim 9, wherein one side of the solid state disk has a plurality of gold fingers for inserting into an electric component.

* * * * *